US012597750B2

(12) United States Patent
Deeg et al.

(10) Patent No.: US 12,597,750 B2
(45) Date of Patent: Apr. 7, 2026

(54) PRINTED CIRCUIT BOARD WITH A CONTACT POINT

(71) Applicant: Knorr-Bremse Systeme Fuer Nutzfahrzeuge GmbH, Munich (DE)

(72) Inventors: Markus Deeg, Eberdingen (DE); Andreas Eisenberger, Nuertingen (DE); Karin Pohley, Nuremberg (DE)

(73) Assignee: KNORR-BREMSE SYSTEME FUER NUTZFAHRZEUGE GMBH, Munich (DE)

( * ) Notice: Subject to any disclaimer, the term of this patent is extended or adjusted under 35 U.S.C. 154(b) by 803 days.

(21) Appl. No.: 17/904,443

(22) PCT Filed: Feb. 2, 2021

(86) PCT No.: PCT/EP2021/052357
§ 371 (c)(1),
(2) Date: Aug. 17, 2022

(87) PCT Pub. No.: WO2021/170351
PCT Pub. Date: Sep. 2, 2021

(65) Prior Publication Data
US 2023/0105384 A1 Apr. 6, 2023

(30) Foreign Application Priority Data

Feb. 28, 2020 (DE) ..................... 10 2020 105 298.7

(51) Int. Cl.
*H01R 13/33* (2006.01)
*B60R 16/02* (2006.01)
(Continued)

(52) U.S. Cl.
CPC ......... *H01R 43/0256* (2013.01); *B60R 16/02* (2013.01); *H01R 12/57* (2013.01);
(Continued)

(58) Field of Classification Search
None
See application file for complete search history.

(56) References Cited

U.S. PATENT DOCUMENTS 5,600,102 A 2/1997 Socha
5,709,574 A * 1/1998 Bianca ................. H01R 12/718
439/83

(Continued)

FOREIGN PATENT DOCUMENTS

CN 104701654 A 6/2015
CN 105706308 A 6/2016
(Continued)

OTHER PUBLICATIONS

International Search Report dated Apr. 13, 2021 for PCT/EP2021/052357.

*Primary Examiner* — Tho D Ta
(74) *Attorney, Agent, or Firm* — NORTON ROSE FULBRIGHT US LLP

(57) ABSTRACT

A printed circuit board, including: a contact point for contacting; a contact spring for an electrical contact in a vehicle; in which the contact point has a support element of tin that is reflow soldered to the printed circuit board. Also described are a related module and method.

15 Claims, 3 Drawing Sheets

(51) Int. Cl.

| | |
|---|---|
| *H01R 12/57* | (2011.01) |
| *H01R 43/02* | (2006.01) |
| *H05K 3/3478* | (2026.01) |
| *H05K 3/40* | (2006.01) |
| *H01R 12/70* | (2011.01) |

(52) U.S. Cl.
   CPC ........... *H01R 13/33* (2013.01); *H05K 3/3478* (2013.01); *H05K 3/4015* (2013.01); *H01R 12/7076* (2013.01); *H01R 2201/26* (2013.01); *H05K 2203/0415* (2013.01)

(56) References Cited

U.S. PATENT DOCUMENTS

| | | | | |
|---|---|---|---|---|
| 6,717,421 | B1 * | 4/2004 | Kazama | ............. G01R 1/06716 |
| | | | | 324/755.05 |
| 6,786,391 | B2 | 9/2004 | Stipp et al. | |
| 7,503,774 | B2 * | 3/2009 | Yumi | ................. H01R 13/2421 |
| | | | | 439/940 |
| 8,814,577 | B2 * | 8/2014 | Nohira | ................... H01R 43/20 |
| | | | | 29/842 |
| 8,925,793 | B2 | 1/2015 | Arunasalam et al. | |
| 9,634,416 | B2 * | 4/2017 | Hein | ..................... H01R 12/718 |
| 11,715,894 | B2 * | 8/2023 | Herges | ................... H01R 12/57 |
| | | | | 439/81 |
| 11,837,807 | B2 * | 12/2023 | Rao | ........................ H01R 13/17 |
| 2014/0193987 | A1 | 7/2014 | Kaurala | |
| 2014/0328039 | A1 | 11/2014 | Koep et al. | |
| 2016/0276770 | A1 | 9/2016 | Hein et al. | |

FOREIGN PATENT DOCUMENTS

| | | | |
|---|---|---|---|
| DE | 102013018851 A1 | 5/2015 | |
| DE | 102015008334 A1 | 12/2016 | |
| EP | 0856447 A2 | 8/1998 | |
| EP | 0954067 A2 | 11/1999 | |
| JP | 2000328286 A | 11/2000 | |
| JP | 2003036908 A | 2/2003 | |
| JP | 2011054875 A | 3/2011 | |
| JP | 2016535921 A | 11/2016 | |
| WO | 2020007583 A1 | 1/2020 | |

* cited by examiner

300

200

100

200

110

100

PRINTED CIRCUIT BOARD WITH A CONTACT POINT

FIELD OF THE INVENTION

The present invention relates to a printed circuit board with a contact point for an electrical contact in a vehicle, to a module for a vehicle having the printed circuit board, and to a method for producing a printed circuit board with a contact point, as well as in particular to contacting for an actuator/sensor in the commercial vehicle by way of a contact spring having a preform mating point on the printed circuit board.

BACKGROUND INFORMATION

Electrical contacts in vehicles are subject to particular requirements in terms of vibration resistance as well as durability under the influences of time and the environment. An electrical contact between electrical components in a vehicle is implemented in a customary manner by a contact spring, thus a helically wound conductor structure which by constructive measures is connected to one of the components and, potentially while utilizing tension effects caused by the material and shape, establishes an electrical contact to another electrical component by bearing on the latter or being placed on the latter, for example. For this purpose, a contact pad by way of which electric current can flow between the two components is situated on the electrical component connected by the contact spring bearing thereon. This contact pad can be configured in particular as part of a printed circuit board, or as an attachment on a printed circuit board.

Specific examples of contacts of such a construction mode are to be found in brake systems of commercial vehicles, in which sensor units are connected to actuators, for example (for example in electronic brake systems, or air treatment plants, having integrated electronic control, which can represent an active mechanical part of an electronic parking brake, for instance), as well as potentially further components are connected in a vibration-tolerant manner by way of electrical contacts. The printed circuit boards here in the context of industrial production, typically by a reflow method (soldering by remelting the solder), are often equipped with SMDs (surface mounted devices). In a reflow method, the printed circuit board populated with conductor paths at already configured contact pads (lands, connector pads) is first provided with a solder paste made from a pulverulent tin solder compound and a flux (for example printed by a screen printing or stencil printing method). As a result of the solder paste, subsequently attached SMDs temporarily adhere to the printed circuit board. By heating the printed circuit board, the solder paste is melted while component parts of the flux are extracted as gas. Surface tension effects adjust the SMDs which are fixed by the cooled solder.

A production method for a contact point on which a contact spring bears or sits, respectively can be advantageously integrated in an existing reflow method with ideally little complexity.

Patent document DE 10 2015 008 334 A1 refers to a configuration of the contact point by a contact plate which is configured in a single layer or in multiple layers and/or as a SMD, comprises the materials nickel or copper and for improving the conductivity or for increased resistance to abrasion is provided with a layer of silver or gold. One disadvantage of configuring the contact point with the aid of a contact plate lies in additional production and material costs which arise for the contact plate.

There is a demand for an alternative electrical contact point on a printed circuit board, which makes electrical contacting possible by placing or attaching an electrical conductor such as, for example, a contact spring, as well as for an improved method for producing such a contact point on a printed circuit board.

SUMMARY OF THE INVENTION

At least some of the above-mentioned objects may be achieved by a printed circuit board having a contact point as described herein, by a module as described herein, and a method as described herein. The further embodiments define further advantageous embodiments of the subject matter of the main embodiments and descriptions herein.

The present invention relates to a printed circuit board having a contact point for contacting, having a contact spring for an electrical contact in a vehicle, wherein the contact point has a support element of tin which by a reflow method is soldered to the printed circuit board.

The printed circuit board is a carrier for an electric circuit having one or a plurality of electrical lines and potentially electrical components which have been applied to the printed circuit board by the reflow method, for example. The support element can be composed completely of tin which has been fully or partially liquefied during the reflow method and bears directly on a contact pad of the printed circuit board. The contact pad (land, connector pad) here is a region which has been predetermined in the context of the reflow method for the position of the support element, on which one or a plurality of conductor paths on the surface of the printed circuit board terminate.

The support element above the printed circuit board optionally has a height of at least 50 micrometers and at most 150 micrometers so as to ensure vibration-resistant contacting.

The contacting takes place by bringing to bear a conductor on the surface of the support element. Vibrations and/or shocks which are caused by the movement of a vehicle comprising the printed circuit board and the conductor, for example, can lead to mutual movements of the support element and of the conductor bearing thereon. As a result of the movements and/or as a result of a pressure exerted by the conductor on the support element, material may be subtracted from regions of the surface of the support element. The height of the support element above the printed circuit board is advantageously chosen such that long-term contacting is guaranteed.

The support element optionally has one of the following footprints:
a circular disk,
an oval disk,
a circular ring,
a face with a polygonal periphery,
one of the shapes mentioned, further clearances being present in the interior thereof.

The choice of a footprint advantageously facilitates attaching the contact point to the printed circuit board, securing a position of an electrical conductor bearing on the contact point and/or producing the support element, for example as a solder preform.

The present invention also relates to a module for a vehicle, in particular a commercial vehicle, having a printed circuit board which has a contact point as described above, and furthermore having a contact spring as well as having a construction element which by way of the contact spring is electrically connected to the support element of the contact point of the printed circuit board.

The contact spring here is a suitably bent conductor piece, for example a helically wound or coil-shaped wire which bears or sits on the surface of the support element. The contact spring can exert a mechanical pressure on the support element. Moreover, the contact spring is fastened to the construction element; to this end, said contact spring can be riveted, clamped, soldered, welded, plugged in, held by a holding device such as, for example, a dielectric housing, or be configured as an end of an electrical conductor, for example.

The contact spring by way of one end optionally bears on a surface of the support element, wherein the surface of the support element is larger than the cross-sectional area of the bearing end of the contact spring.

A surface of the support element that protrudes beyond the cross-sectional area of the contact spring can for guaranteeing a tolerance for a position of the end of the contact spring, in particular even under vibration or shock, for example. A vibration of the end of the contact spring here can advantageously be utilized for counteracting any corrosion and/or oxidation of the surface of the support element as a result of parts of the surface being subtracted.

The surface of the support element optionally has a depression and/or a bulge, which are/is configured for securing a position of the bearing end of the contact spring.

For example, the depression can be tub-shaped, or can be adapted annularly to the cross-sectional contour of the contact spring and enclose a central bulge. The depression here can also be created as a result of a pressure exerted by the contact spring on the support element and/or be further increased in depth over time.

The construction element optionally has an actuator and/or a sensor, wherein the contact establishes an electrical connection between the actuator and/or the sensor and the printed circuit board in a commercial vehicle.

The present invention also relates to a method for producing a printed circuit board with a contact point, said method comprising the following steps:

providing a printed circuit board with a contact pad;
    applying a support element of tin to the contact pad;
    connecting the support element to the printed circuit board by a reflow method.

The support element applied in the reflow method advantageously melts in the process so that direct contact with the conductor that appears on the surface in the contact pad of the printed circuit board is established. The at least partial melting of the support element in the reflow method represents a compromise between the standard of applying a SMD and the standard of tinning.

Applying the support element optionally includes printing the contact pad with a solder paste, wherein solder fluxes present are consumed to the extent that said solder fluxes, when contacting a conductor bearing on the contact point, do not reduce the conductivity of the contact point.

The solder paste in standardized reflow methods contains a flux which exits by heating in the context of the reflow method and may leave behind residues and/or form residues on the surface of the solder, for example, said residues compromising the conductivity of the contact point. This would be the case in particular when the support element would be dispensed with for configuring the contact point, and only a solder paste would be used, for example. Residues of additives on the surface of the contact point can be prevented by suitable heating and/or by choosing a suitable geometry of the support element, such as a sufficient thickness, for example.

Optionally, at least one surface mounted construction element is to be fastened to the printed circuit board during the method, wherein the step of connecting is simultaneous soldering of the support element and of the surface mounted construction element.

The attaching of the contact point can thus be integrated in an existing reflow method for attaching surface mounted construction elements without the requirement of introducing additional method steps in the reflow method.

The tin of the support element here can also contain additives such as, for example, lead, zinc, silver, iron, antimony, copper or a flux, which advantageously influence a function of the support element as a contact point for placing an electrical conductor and/or a method for applying the support element to the printed circuit board, without modifying the mentioned features of the contact point or of the method. These additives may also be incorporated in the support element so as to be continuously graded in one direction.

Advantages of exemplary embodiments lie in cost saving, for example, as a result of dispensing with the production of a contact plate or any other SMD or plug-through assembly component configured for the object;
    as a result of a cost-effective production of the support element as a solder preform, wherein solder preforms can moreover already be used at other locations in the reflow method;
    as a result of the ability of integration in an existing reflow method for assembling the printed circuit board.

Further advantages lie in a positive electrical conductivity of the electrical contact as a result of a compatibility in particular with a surface finish of the contact pad of tin, so that a direct, homogenous connection between the surface of the support element and the (copper) line can be achieved;
    the thickness of the support element and an air-tight connection of the footprint of the latter to the printed circuit board, this preventing oxidation of a copper line appearing on the printed circuit board surface at least in the contact pad.

Further advantages lie in securing the position of the bearing conductor, to the extent that the latter bears on the support element under pressure and, as a result, is partially pressed into the support element.

In comparison to localized tinning of the conductor surface, as can be performed by way of a galvanic process or else a tin bath, for example, there is furthermore an advantage in the form of a suitably extended or adjustable, respectively, service life by adapted thickness and shape of the solder preform.

Furthermore, in comparison to implementing a contact point solely by applying solder paste, an advantage lies in that no deposits of flux residues arise on the surface of the support element in the present method, and no drop in the conductivity arises as a result.

The exemplary embodiments of the present invention will be more readily understood based on the detailed description hereunder and the appended drawings of the various exemplary embodiments, the latter are however not to be understood as limiting the disclosure to the specific embodiments but serving merely the purpose of explanation and understanding.

DETAILED DESCRIPTION

Figure 1:
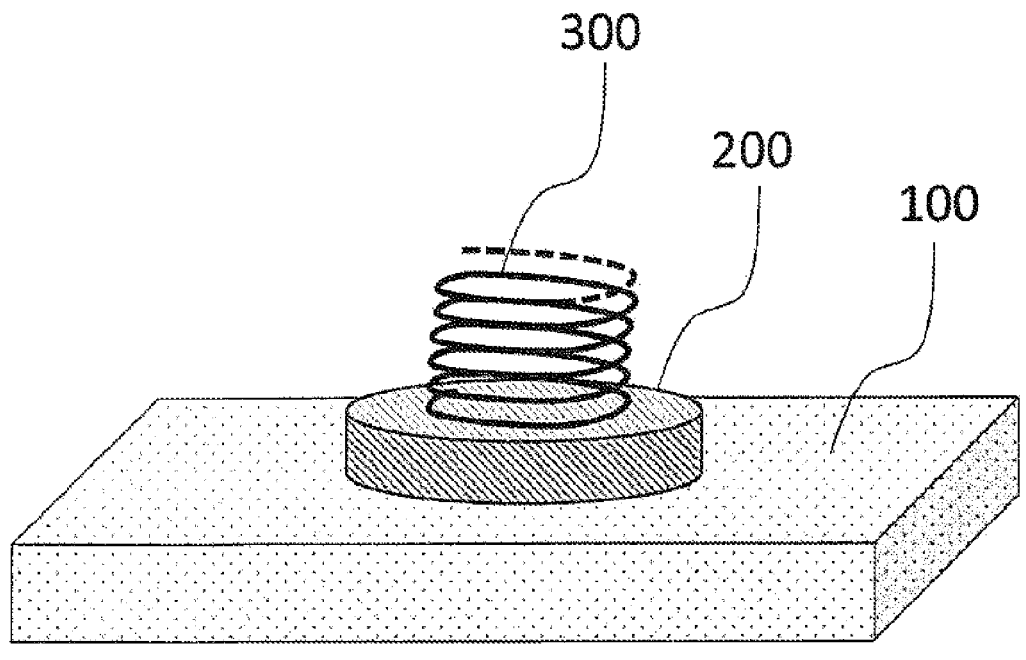
FIG. 1 shows an exemplary embodiment according to the present invention of a printed circuit board with a contact point.

FIG. 1 shows an exemplary embodiment of the present invention of a printed circuit board 100 having a contact point for contacting, having a contact spring 300 for an electrical contact in a vehicle, wherein the contact point has a support element 200 of tin which by a reflow method is soldered to the printed circuit board 100.

Illustrated here is a portion of the printed circuit board 100, the latter potentially containing further components. The contact spring 300 is not fixed to the support element 200 but needs only to bear thereon.

Figure 2:
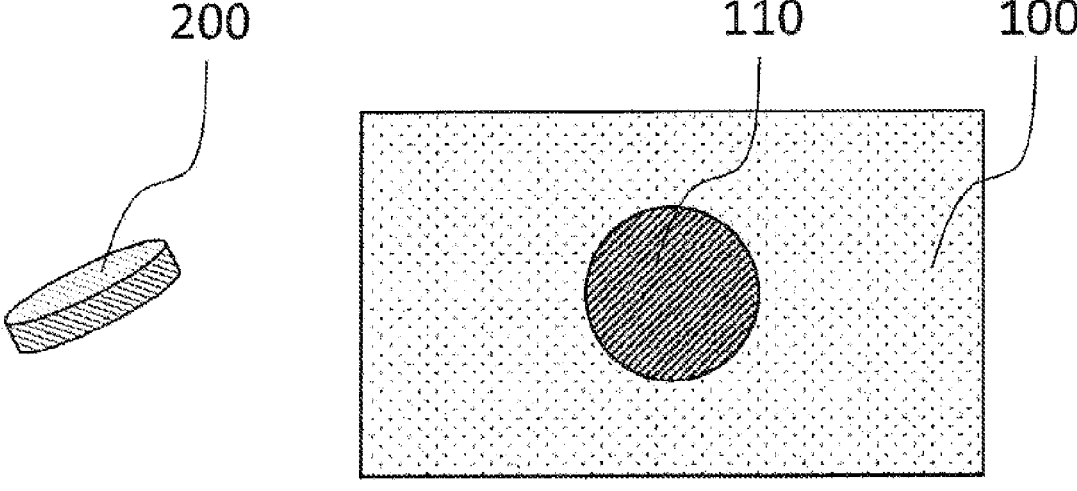
FIG. 2 on the left shows a support element and on the right shows a plan view of a printed circuit board with a contact pad.

FIG. 2 on the left-hand side shows a view of an exemplary embodiment of the support element 200 as a solder preform produced from tin. Illustrated on the right-hand side is a fragment of an exemplary embodiment of a printed circuit board 100 in a plan view, a contact pad 110 being situated in the latter. The contact pad 110 is a region of the printed circuit board 100 in which a conductor path of the printed circuit board 100 (not illustrated here) appears on the printed circuit board surface. Such conductor paths can consist, for example, of copper. Since oxidation processes compromise the contactability of exposed copper over time, the contact pad 110 in one of the last method steps for producing the printed circuit board 100 is coated with a surface finish, for example of tin, silver or gold.

Figure 3:
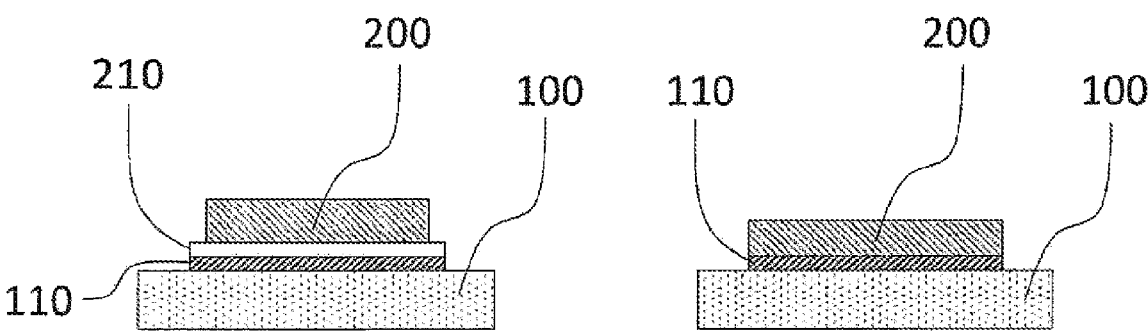
FIG. 3 on the left shows a support element placed on a contact pad with solder paste, prior to heating and fusing in a reflow method, and on the right shows the support element on the contact pad after heating and fusing.

FIG. 3 on the left-hand side shows a local cross section through a printed circuit board 100 in a situation prior to solder being remelted in a reflow method. A contact pad 110 having solder paste 210 applied thereto is situated on the printed circuit board 100, a solder preform of tin as the support element 200 in turn bearing on said contact pad 110. The tin of the support element 200 in the reflow method fuses with the solder paste 210 and optionally, for example when configuring the surface finish of the contact pad 110 of tin, with the material of the surface finish of the contact pad 110.

Illustrated on the right-hand side of the figure is the printed circuit board 100 with the contact pad 110 and the support element 200 after remelting of solder in the reflow method. A contact point that adjoins the conductor path in a homogenous manner can in particular be formed in this way in the case of a contact pad 110 with a surface finish of tin.

Figure 4:
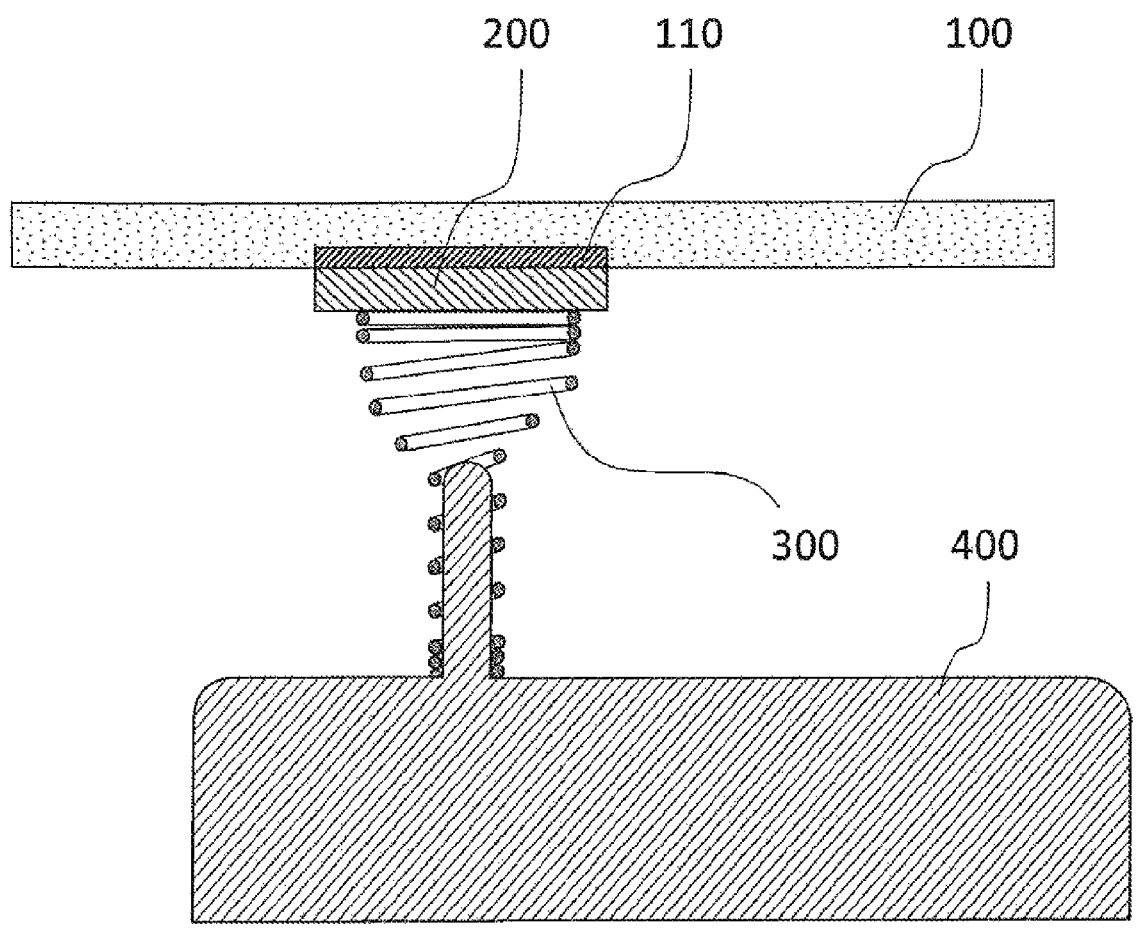
FIG. 4 shows a module having a printed circuit board with a support element, a spring and a component.

FIG. 4 shows a lateral sectional view of an exemplary embodiment of a module for a vehicle, in particular a commercial vehicle, having a printed circuit board 100 in which a contact pad 110 is configured, a support element 200 of tin being attached to said contact pad 110 in the context of a reflow method. A contact spring 300 bears on the support element 200, said contact spring 300 being part of a construction element 400 which by way of the contact spring 300 is electrically connected to the support element 200 of the contact point of the printed circuit board 100.

The printed circuit board 100 can be part of a sensor in a brake system of a vehicle, for example.

A surface finish of the contact pad 110 of tin, prior to the support element 200 being applied, can have a thickness of one micrometer, for example. This thickness is typically reduced during the reflow method, for example by 0.2 micrometers. This thickness would be insufficient for a contact spring 300 to bear thereon, because corrosion and oxidation processes, and, when the contact spring 300 bears thereon, also abrasion processes, rapidly corrupt the surface finish. The support element 200 above the printed circuit board 100 can advantageously have a height in a range from 50 to 150 micrometers, and as a result ensure long-term contacting as well as the protection of a conductor path of the printed circuit board 100 that terminates at the contact pad 110. Since the height may be partially reduced during the reflow method, the support element 200 prior to being placed on the contact pad 110 of the printed circuit board 100 has a greater height (for example by 10 to 50 micrometers).

The construction element 400 can comprise, for example, an actuator such as, for instance, a solenoid valve, in a brake system of a vehicle.

Figure 5:
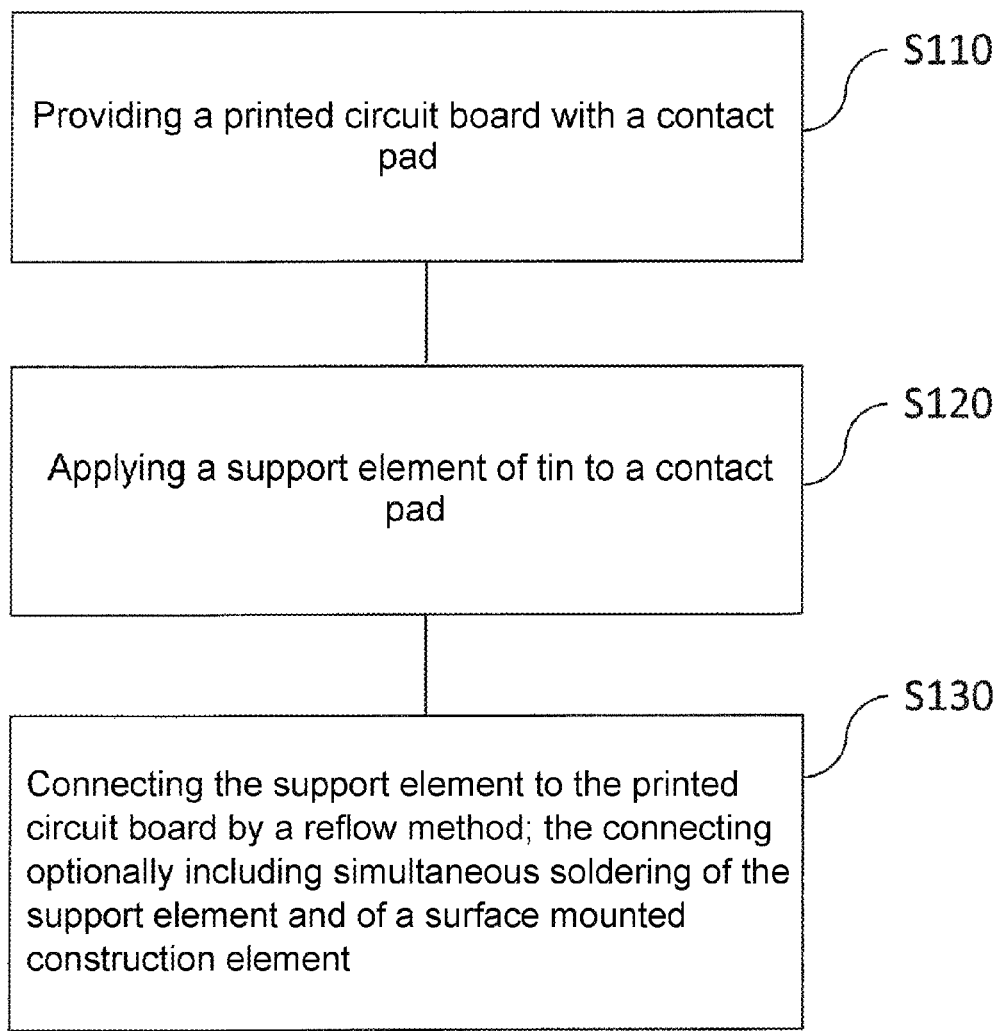
FIG. 5 shows a method for producing a printed circuit board with a contact point according to the present invention.

FIG. 5 shows a method for producing a printed circuit board 100 with a contact point, said method comprising the following steps:

provisioning S110 a printed circuit board 100 with a contact pad 110;

applying S120 a support element 200 of tin to the contact pad 110;

connecting S130 the support element 200 to the printed circuit board 100 by a reflow method.

The support element 200 during the reflow method is liquefied by heating, wherein said support element 200 can fuse with a previously applied solder paste 210 and optionally with the material of a surface finish of the contact point 110. A homogenous contact with a conductor path of the printed circuit board 100 that terminates in the contact pad 110 is established as a result.

The reflow method here can comprise assembling further components on the printed circuit board 100. In this way, the attaching of the contact point can be integrated in an existing reflow method, without the requirement of introducing an additional method step.

The features of the invention that are disclosed in the description, the claims and the figures can be essential for implementing the invention individually as well as in any arbitrary combination.

THE LIST OF REFERENCE SIGNS IS AS FOLLOWS

100 Printed circuit board
110 Contact pad
200 Support element
210 Solder paste
300 Contact spring
400 Construction element
S110, S120, S130 Method steps

The invention claimed is:

1. A module for a vehicle or a commercial vehicle, comprising:

a printed circuit board including a contact point for contacting a contact spring for an electrical contact, wherein the contact point has a support element;

the contact spring for the electrical contact in the vehicle or the commercial vehicle; and a construction element, which is electrically connected by the contact spring to the support element of the contact point of the printed circuit board;

wherein the support element is a solder preform made of tin and is soldered to the printed circuit board using a reflow process, and wherein the contact spring bears against a surface of the support element.

2. The module of claim 1, wherein the support element is above the printed circuit board, and has a height of at least 50 micrometers and at most 150 micrometers so as to ensure vibration-resistant contacting.

3. The module of claim 1, wherein the support element has one of the following footprints: a circular disk, an oval disk, a circular ring, or a face with a polygonal periphery, and wherein of the one of the footprints, further clearances are present in the interior thereof.

4. The module of claim 1, wherein the construction element has an actuator and/or a sensor for establishing an electrical connection between the actuator and/or the sensor and the printed circuit board in the vehicle or the commercial vehicle.

5. The module of claim 1, wherein the solder preform is composed completely of tin.

6. The module of claim 1, wherein the support element is configured to have material removed from regions of the surface of the support element: (i) by mutual movement of the support element and the conductor spring and/or (ii) by pressure exerted by the conductor spring on the surface of the support element.

7. The module of claim 1, wherein a part of the support element is configured in the printed circuit board.

8. The module of claim 1, wherein the contact spring bears on the support element by way of one end, and wherein a surface of the support element is larger than a cross-sectional area of the bearing end of the contact spring.

9. The module of claim 8, wherein the surface of the support element has a depression and/or a bulge for receiving the bearing end of the contact spring, so as to secure a position of the bearing end of the contact spring.

10. A method for producing a component for a commercial vehicle, the component including a printed circuit board having a contact point for contacting a contact spring for an element contact, and a component, the method comprising:

providing the printed circuit board with the contact pad;

applying a support element to the contact pad, the support element being a solder preform made of tin;

connecting the support element to the printed circuit board by reflow soldering and applying the contact spring to a surface of the support element so that the component is in electrical connection with the support element, and the contact spring bears against the surface of the support element.

11. The method of claim 10, wherein the applying of the support element includes printing the contact pad with a solder paste, and wherein solder fluxes present by heating are consumed to the extent that the solder fluxes, when contacting a conductor bearing on the contact point, do not reduce the conductivity of the contact point.

12. The method of claim 10, wherein at least one surface mounted construction element is to be fastened to the printed circuit board, and wherein the connecting includes simultaneous soldering of the support element and of the surface mounted construction element.

13. The method of claim 10, wherein the solder preform is composed completely of tin.

14. The method of claim 10, wherein the support element is configured to have material removed from regions of the surface of the support element: (i) by mutual movement of the support element and the conductor spring and/or (ii) by pressure exerted by the conductor spring on the surface of the support element.

15. The method of claim 10, wherein a part of the support element is configured in the printed circuit board.

* * * * *